(12) United States Patent
Morita et al.

(10) Patent No.: US 11,279,904 B2
(45) Date of Patent: Mar. 22, 2022

(54) CLEANING LIQUID COMPOSITION

(71) Applicant: Kanto Kagaku Kabushiki Kaisha, Tokyo (JP)

(72) Inventors: Kikue Morita, Saitama (JP); Areji Takanaka, Saitama (JP); Takuo Ohwada, Saitama (JP)

(73) Assignee: KANTO KAGAKU KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/473,625

(22) PCT Filed: Dec. 26, 2017

(86) PCT No.: PCT/JP2017/046737
§ 371 (c)(1),
(2) Date: Jun. 26, 2019

(87) PCT Pub. No.: WO2018/124109
PCT Pub. Date: Jul. 5, 2018

(65) Prior Publication Data
US 2019/0345419 A1    Nov. 14, 2019

(30) Foreign Application Priority Data
Dec. 27, 2016    (JP) .............................. JP2016-254312

(51) Int. Cl.
*C11D 11/00*      (2006.01)
*C11D 3/28*      (2006.01)
(Continued)

(52) U.S. Cl.
CPC ............ *C11D 11/0047* (2013.01); *C11D 3/28* (2013.01); *C11D 3/30* (2013.01); *C11D 3/33* (2013.01);
(Continued)

(58) Field of Classification Search
CPC .... C11D 3/33; C11D 3/30; C11D 3/28; C11D 3/361; C11D 11/0047; H01L 21/3212;
(Continued)

(56) References Cited

U.S. PATENT DOCUMENTS

2009/0286708 A1   11/2009   Murakami et al.
2010/0178767 A1*   7/2010   Schubert ............. H01L 21/3212
                                                  438/692

(Continued)

FOREIGN PATENT DOCUMENTS

JP    2015-165561 A    9/2015
JP    2016-86094 A    5/2016
(Continued)

OTHER PUBLICATIONS

Pubchem, "1-H Pyrazole-4-carboxylic acid" via https://pubchem.ncbi.nlm.nih.gov/compound/1H-Pyrazole-4-carboxylic-acid#section =2D-Structure ; pp. 1-21; No date available.*
(Continued)

*Primary Examiner* — Binh X Tran
(74) *Attorney, Agent, or Firm* — McDonnell Boehnen Hulbert & Berghoff LLP

(57) ABSTRACT

Provided is a cleaning liquid composition which is useful for cleaning of a substrate or the like that has been subjected to a chemical mechanical polishing (CMP) process, etc in the production steps of an electronic device such as a semiconductor element. A cleaning liquid composition according to the present invention is used for the purpose of cleaning a substrate that has a Cu wiring, and comprises one or more basic compounds and one or more nitrogen-containing monocyclic heterocyclic aromatic compounds that contain one or more carboxyl groups or ester groups, provided that in cases where one or more amino groups are contained therein, only amino groups directly bonded to a nitrogen-
(Continued)

containing heterocyclic rind are contained. This cleaning liquid composition has a hydrogen ion concentration (pH) of 8-12.

8 Claims, 4 Drawing Sheets

(51) Int. Cl.
    *C11D 3/30* (2006.01)
    *C11D 3/33* (2006.01)
    *C11D 3/36* (2006.01)
    *C11D 17/00* (2006.01)
    *C23G 1/20* (2006.01)
    *H01L 21/02* (2006.01)
    *H01L 21/321* (2006.01)
    *H01L 23/532* (2006.01)

(52) U.S. Cl.
    CPC .......... *C11D 3/361* (2013.01); *C11D 17/0008* (2013.01); *C23G 1/20* (2013.01); *H01L 21/02074* (2013.01); *H01L 21/3212* (2013.01); *H01L 23/53238* (2013.01)

(58) Field of Classification Search
    CPC ........ H01L 21/02074; H01L 23/53238; C23G 1/20
    USPC ................................. 252/79.1, 79.4
    See application file for complete search history.

(56) References Cited

U.S. PATENT DOCUMENTS

| | | | | |
|---|---|---|---|---|
| 2016/0060584 A1* | 3/2016 | Mizuta | ................. | C11D 7/3209 510/175 |
| 2016/0083675 A1* | 3/2016 | Morita | ................. | C11D 7/3209 438/687 |
| 2016/0340620 A1* | 11/2016 | Sun | ................. | H01L 21/02063 |
| 2018/0037852 A1* | 2/2018 | Thomas | ............ | H01L 21/02063 |

FOREIGN PATENT DOCUMENTS

| | | | | |
|---|---|---|---|---|
| WO | WO-2014171355 A1 * | 10/2014 | ................. | C11D 3/30 |
| WO | WO 2016/111990 A1 | 7/2016 | | |

OTHER PUBLICATIONS

Pubchem, "5-Methyl-1H-pyrazole-3-carboxylic acid" via https://pubchem.ncbi.nlm.nih.gov/compound/5-Methyl-1H-pyrazole-3-carboxylic-acid#section=2D-Structure ; pp. 1-27; No date available.*
Sigma-Aldrich, "3,5-Pyrazoledicarboxylic acid monohydrate" via https://www.sigmaaldrich.com/catalog/product/aldrich/p56801?lang =en®ion=US ; pp. 1-3; No date available.*
Wikipedia, The Free Encyclopeida; "Histidine" via https://en.wikipedia.org/wiki/Histidine ; pp. 1-7; Year: 2020.*
Chemistry Dictionary, "Definition of pH" via https://www.chemicool.com/definition/ph.html ; pp. 1-3; Year 2017.*
Sigma-Aldrich, "4-Imidazolecarboxylic acid", via https://www.sigmaaldrich.com/catalog/product/aldrich/425842?lang=en&region=US ; pp. 1-3, No Date available.*
PubChem; "1H-1,2,4- Triazole-3-carboxylic acid, 5 amino", via https://pubchem.ncbi.nlm.nih.gov/compound/3-Amino-1_2_4-triazole-5-carboxylic-acid ; p. 1-23; No data available.*
PubChem; "1H-Pyrazole-3,5 dicarboxylic aicd", via https://pubchem.ncbi.nlm.nih.gov/compound/1H-Pyrazole-3_5-dicarboxylic-acid ; pp. 1-25; No date available.*
Wikipedia, "Choline" https://en.wikipedia.org/wiki/Choline ; pp. 1-18; No date available.*
Millipore Sigma, "Imidazole-4,5-dicarboxylic acid" via https://www.emdmillipore.com/US/en/product/Imidazole-45-dicarboxylic-acid,MDA_CHEM-818370 ; pages (Year: 2021).*
Extended European Search Report for Application No. 17886971.5 dated Jun. 25, 2020.

* cited by examiner

[Fig. 1]
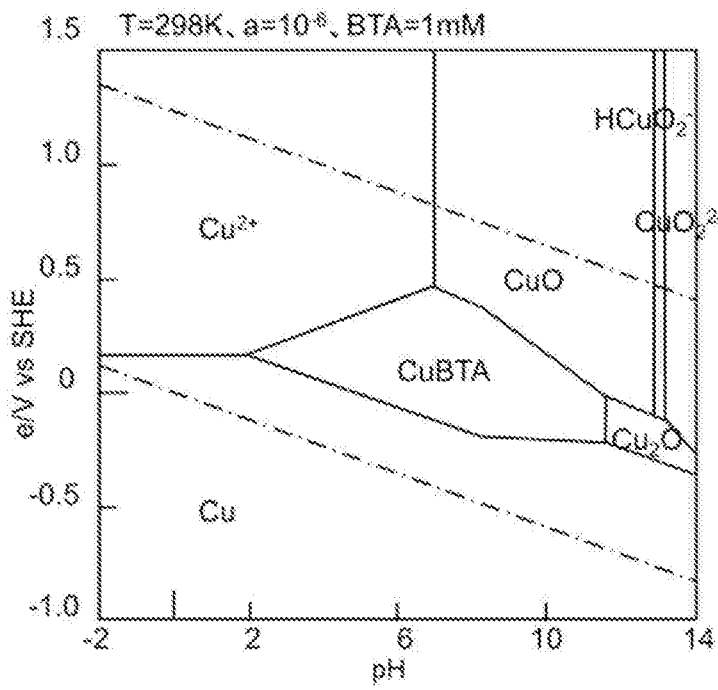
Pourbaix diagram for Cu-BTA-water system
[Fig. 2]
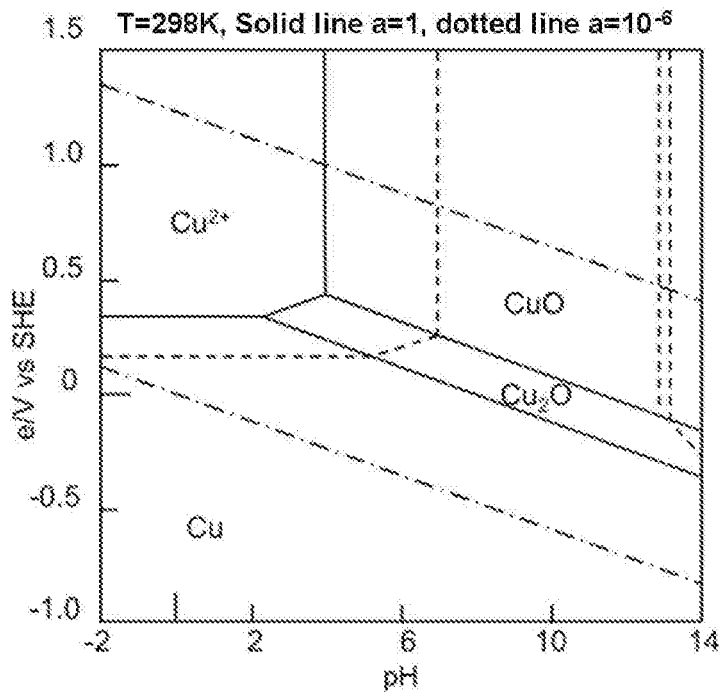
Pourbaix diagram for Cu-water system

[Fig. 3]
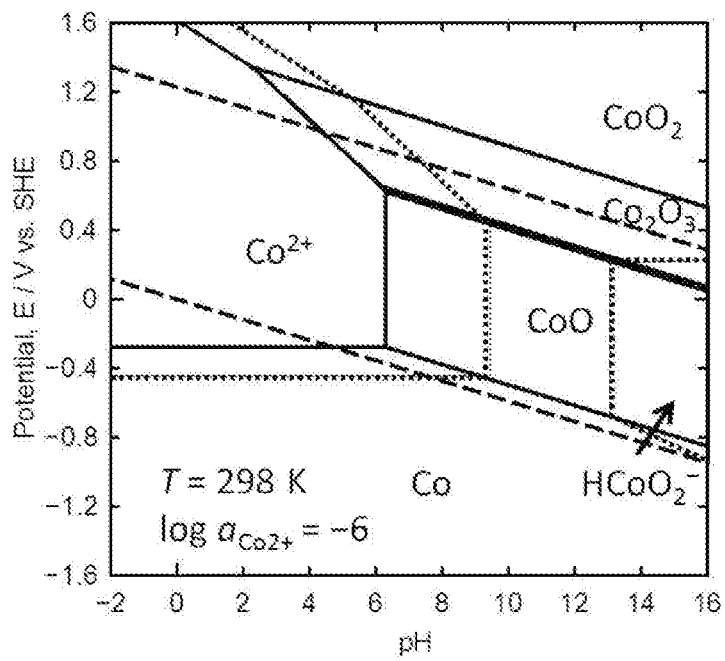
Pourbaix diagram for Co-water system
[Fig. 4]
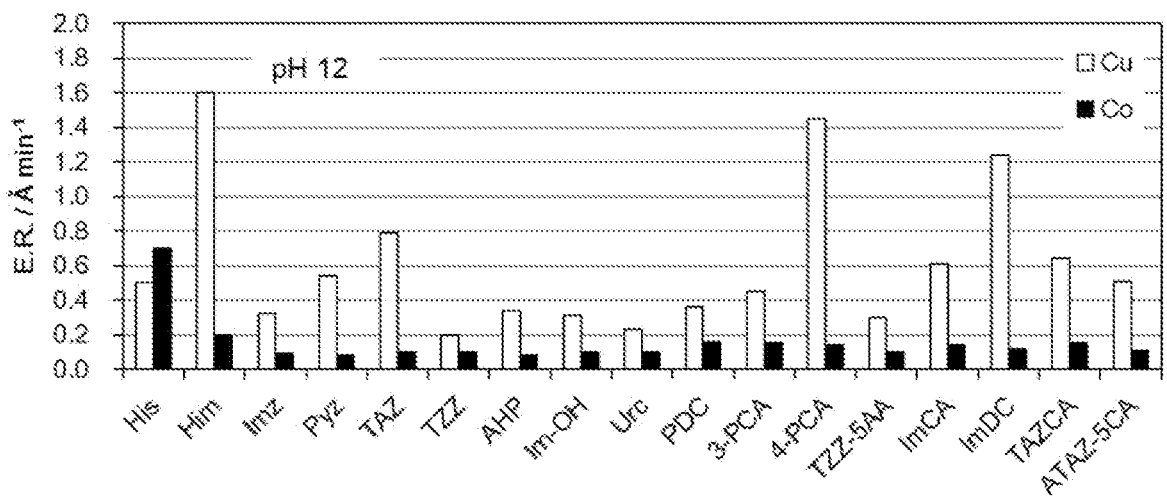

[Fig. 5]
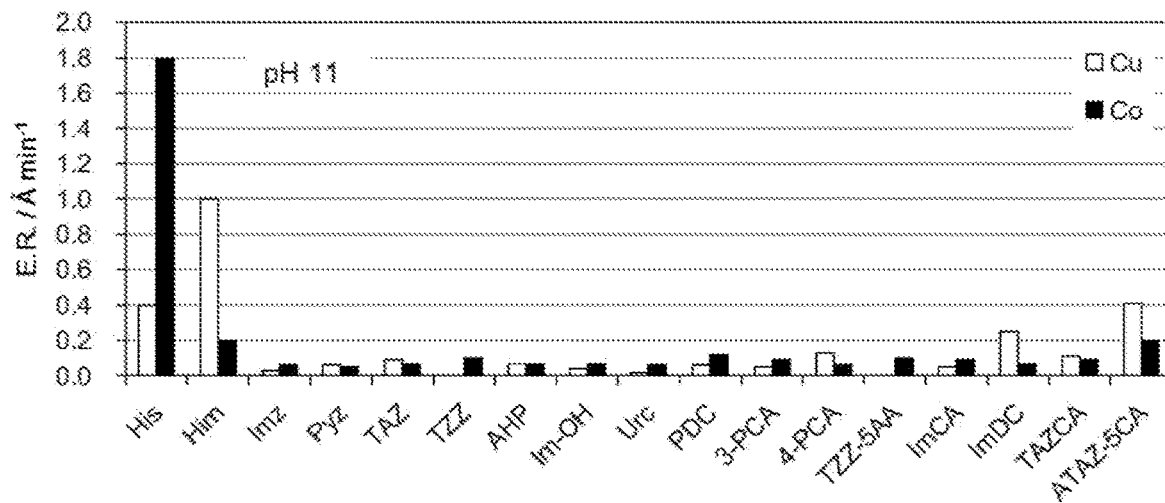
[Fig. 6]
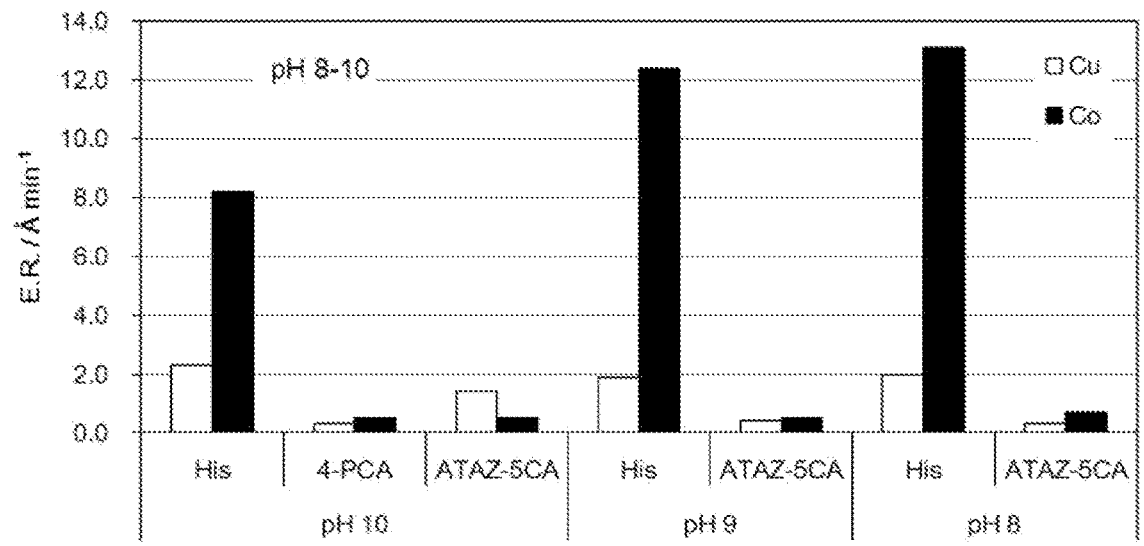

[Fig. 7]
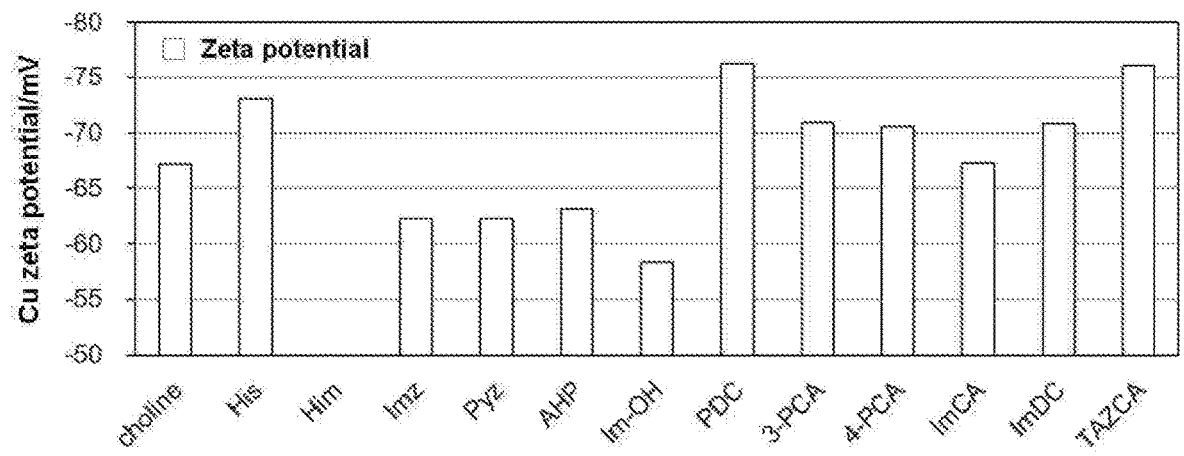

CLEANING LIQUID COMPOSITION

This application is a U.S. National Phase application under 35 U.S.C. § 371 of PCT/JP2017/046737, filed Dec. 26, 2017, which claims the benefit of JP Application No.: 2016-254312 filed Dec. 27, 2016. The entire disclosure contents of these applications are herewith incorporated by reference in their entirety into the present application.

TECHNICAL FIELD

The present invention relates to a cleaning liquid composition used for cleaning a substrate having Cu wiring, a stock solution composition for obtaining the cleaning liquid composition, and a method of manufacturing a semiconductor substrate using the cleaning liquid composition.

BACKGROUND ART

With the high integration of ICs, contamination of a very small amount of impurities greatly affects the performance and yield of devices, so that strict contamination control is required. That is, strict control of contamination of substrates is required, and therefore, various cleaning liquids are used in each process of semiconductor substrate manufacturing.

Generally, as cleaning liquid for semiconductor substrates, ammonia-hydrogen peroxide water-water (SC-1) that is an alkaline cleaning liquid is used for the removal of particle contamination, and acid cleaning liquids such as sulfuric acid-hydrogen peroxide water, hydrochloric acid-hydrogen peroxide water-water (SC-2), dilute hydrofluoric acid, etc. are used for the removal of metal contamination; and each cleaning liquid is used singly or in combination depending on the purpose.

Meanwhile, with the progress of device miniaturization and multilayer wiring structure, more precise planarization of the substrate surface is required in each process, and, as a new technology for the semiconductor substrate manufacturing process, chemical mechanical polishing (CMP) technology has been introduced, wherein a wafer is pressed against a polishing cloth called buff and rotated while a mixture slurry of abrasive particles and chemicals is supplied, thereby subjecting the wafer to chemical action and physical action in combination to polish and planarize insulating films and metal materials.

In particular, in a leading-edge device using Cu of which the wiring resistance is lower than that of the conventional Al, formation of Cu wiring by a damascene process is performed. The damascene process is a process of forming a wiring pattern, wherein the wiring pattern is formed as a groove in an interlayer insulating film, Cu is embedded therein using sputtering or electrolytic plating, then unnecessary blanket Cu is removed by chemical mechanical polishing or the like.

In addition, a barrier metal layer is generally formed between Cu wiring and an insulating film of a semiconductor substrate, in order to prevent Cu from diffusing into the insulating film.

Conventionally, Ti-based compounds and Ta-based compounds formed into films by physical vapor deposition (PVD) have been used as a barrier metal. However, in order to realize further miniaturization of the device structure in recent years, introduction of new metallic materials such as Co by chemical vapor deposition (CVD) or atomic layer deposition (ALD) which is advantageous for forming a dense metal film in a fine and deep structure, is being promoted.

The substrate surface after CMP is contaminated by particles represented by alumina, silica, and cerium oxide particles contained in the slurry, and by constituents of the surface to be polished and metal impurities derived from chemicals contained in the slurry. These contaminants cause pattern defects, adhesion defects, electrical characteristic defects, etc., so they need to be completely removed before next step. As a general post-CMP cleaning for removing these contaminants, brush cleaning which combines chemical action of a cleaning liquid and physical action of a polyvinyl alcohol sponge brush, etc. is performed.

In a damascene process for forming Cu wiring, an organic anticorrosive agent is added to the CMP slurry for the purpose of controlling the polishing rate of Cu. Benzotriazole (BTA) is mainly used as an organic anticorrosive agent, and such organic anticorrosive agent reacts with Cu in the CMP process to form a dimer and an oligomer cross-linked via Cu, and remains on the substrate surface as a poorly soluble organic residue such as a Cu-benzotriazole (BTA) complex; so the semiconductor substrate is subjected to a cleaning step using a post-CMP cleaning liquid in order to remove such organic residue. Furthermore, in order to achieve more precise planarization of the semiconductor substrate, suppression of the corrosion of Cu in the cleaning liquid is an important characteristic of the post-CMP cleaning liquid in addition to the organic residue removability. Patent Document 1 proposes a cleaning liquid comprising an anticorrosive agent which contains an imidazole derivative having a specific substituent and an azole compound, and Patent Document 2 proposes a cleaning liquid comprising an anticorrosive agent having a specific amino acid structure. However, since all the anticorrosive agents contained therein are strongly adsorbed onto Cu, there is a problem that not only the anticorrosive agents themselves become a source of new organic residue, but also that the removability of organic residue is lowered.

Furthermore, Patent Document 3 proposes a cleaning liquid that does not comprise an anticorrosive agent and that uses a specific nitrogen-containing heterocyclic monocyclic aromatic compound as an organic residue removing component; by using said cleaning liquid, organic residue can be dissolved and furthermore, protection of the cleaned Cu surface by a thin oxide layer to prevent oxidation becomes possible. However, since Co, which is newly introduced as a barrier metal layer, is a metal less noble than Cu that is in contact, occurrence of galvanic corrosion of Co in a cleaning liquid is pointed out, and in this Patent Document, the case of cleaning a semiconductor substrate having a Co barrier metal layer is not considered, and in cleaning of a substrate having such a most advanced barrier metal layer, the effect obtained by the conventional cleaning of substrates may not be always exerted.

As described above, a cleaning liquid composition which is excellent in removability of impurities such as metal impurities, particles and organic residues adhering to the wafer surface after CMP, especially organic residues, and which has no problem in the Cu corrosion and in the damage to a barrier metal less noble than Cu, such as Co in particular, has not yet been known.

CITATION LIST

Patent Document

[Patent Document 1] JP A No. 2015-165561
[Patent Document 2] JP A No. 2016-86094
[Patent Document 3] JP A No. 2014-212262

SUMMARY OF INVENTION

Problems to be Solved by Invention

Therefore, an object of the present invention is, in the cleaning of metal material surface of a substrate which has been subjected to polishing treatment, etching treatment, chemical mechanical polishing (CMP) treatment and the like in the process of manufacturing electronic devices such as semiconductor elements, to provide a cleaning liquid composition that is excellent in removal of impurities such as metal impurities, fine particles, and organic residues which are reaction products of Cu and organic anticorrosive agent, in particular organic residues, without corrosion to metal materials such as Cu, and that can suppress further oxidation by protecting the Cu surface after cleaning with a thin oxide film layer, and that can also suppress corrosion of a barrier metal caused at the interface due to the corrosion potential difference between Cu and the barrier metal that is in contact with Cu and is less noble than Cu. In addition, an object of the present invent ion is to provide a cleaning liquid composition which can be used not only for cleaning a substrate, but also for dissolving an organic residue containing Cu in any application, and a method of dissolving an organic residue using said cleaning liquid composition.

[Means of Solving Problems]

In earnest studies to solve the above problems, the present inventors have found that, a cleaning liquid composition which comprises one or more basic compounds and one or more nitrogen-containing heterocyclic monocyclic aromatic compounds having one or more carboxyl groups or ester groups, but having only amino groups directly bonded to the nitrogen-containing heterocyclic ring when having one or more amino groups, and which has a hydrogen ion concentration (pH) of 8 to 12, has a high removability to metal impurities and fine particles, in particular organic residues, without occurrence of corrosion of metal materials such as Cu, and is capable of suppressing further oxidization by protecting the Cu surface after cleaning with a thin oxide film, and also capable of suppressing damage to the barrier metal layer; and as a result of further research, the inventors have completed the present invention.

That is, the present invention relates to the following.

[1] A cleaning liquid composition for cleaning a substrate having Cu wiring, which comprises one or more basic compounds and one or more nitrogen-containing heterocyclic monocyclic aromatic compounds having one or more carboxyl groups or ester groups, but having only amino groups directly bonded to the nitrogen-containing heterocyclic ring when having one or more amino groups, and which has a hydrogen ion concentration (pH) of 8 to 12.

[2] The cleaning liquid composition according to [1], comprising a compound of the general formula (A) as the nitrogen-containing heterocyclic monocyclic aromatic compound:

[Chemical formula 1]

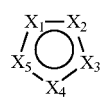

(A)

wherein
$X_1$ to $X_5$ are, each independently of one another, $CR_1$, $CR_1R_2$, N, $NR_1$, O or S, provided that at least two of $X_1$ to $X_5$ are N or $NR_1$,
$R_1$ and $R_2$ are, when a plurality of them are present, each independently of one another, a hydrogen atom or a substituent, provided that at least one of $R_1$ and $R_2$ present in the general formula (A) has a carboxyl group, a substituent having a carboxyl group, an ester group, or a substituent having an ester group.

[3] The cleaning liquid composition according to [2], wherein at least one of $R_1$ and $R_2$ present in the general formula (A) is an amino group.

[4] The cleaning liquid composition according to any one of [1] to [3], wherein the basic compound is a quaternary ammonium compound or a linear aliphatic amine.

[5] The cleaning liquid composition according to any one of [1] to [4], comprising one or more phosphonic acid chelating agents.

[6] The cleaning liquid composition according to [5], wherein the concentration of the phosphonic acid chelating agent at the time of use is 0.005 mM to 0.1 mM.

[7] The cleaning liquid composition according to any one of [1] to [6], further comprising one or more anionic or nonionic surfactants.

[8] The cleaning liquid composition according to any one of [1] to [7], further comprising one or more amino acids.

[9] A stock solution composition for the cleaning liquid composition according to any one of [1] to [8], which is used to obtain said cleaning liquid composition by diluting 10 times to 1000 times.

[10] A method of manufacturing a semiconductor substrate, comprising a step of bringing the cleaning liquid composition according to anyone of [1] to [8] into contact with a substrate having Cu wiring.

[11] The method of manufacturing a semiconductor substrate according to [10], comprising a step of chemical mechanical polishing (CMP) the substrate having Cu wiring prior to the step of bringing the cleaning liquid composition into contact with the substrate having Cu wiring.

[12] The method of manufacturing a semiconductor substrate according to [10] or [11], wherein the step of bringing the cleaning liquid composition into contact with the substrate having Cu wiring is a step of cleaning the substrate having Cu wiring.

[13] The cleaning liquid composition according to any one of [1] to [8] for a substrate for a semiconductor device wherein the barrier metal of the substrate having Cu wiring is made of Co.

The cleaning liquid composition of the present invention is, in the cleaning of metal material surface of a substrate which has been subjected to polishing treatment, etching treatment, chemical mechanical polishing (CMP) treatment and the like in the process of manufacturing electronic devices such as semiconductor elements, excellent in removal of metal impurities, fine particles, and in particular organic residues containing Cu which are reaction products of Cu and organic anticorrosive agent, and it causes no corrosion to metal materials such as Cu, is capable of suppressing further oxidation by protecting the Cu surface after cleaning with a thin oxide film layer, and is capable of suppressing damage to the barrier metal layer that is less noble than Cu. In addition, the cleaning liquid composition of the present invention can be used not only for cleaning substrates, but also for dissolving organic residues containing Cu in any application.

FIG. 1 is a Pourbaix diagram for Cu-BTA-water system.
FIG. 2 is a Pourbaix diagram for Cu-water system.
FIG. 3 is a Pourbaix diagram for Co-water system.
FIG. 4 is a diagram showing Cu and Co etching rates (Å/min) of cleaning liquid compositions containing each compound at pH 12.

FIG. 5 is a diagram showing Cu and Co etching rates (Å/min) of cleaning liquid compositions containing each compound at pH 11.

FIG. 6 is a diagram showing Cu and Co etching rates (Å/min) of cleaning liquid compositions containing each compound at pH 8 to 10.

FIG. 7 is a diagram showing results of measurement of Cu zeta potential using cleaning liquid compositions containing each compound.

EMBODIMENTS FOR CARRYING OUT THE INVENTION

Hereinafter, the present invention will be explained in detail based on preferred embodiments of the present invention.

First, the cleaning liquid composition and the stock solution composition of the present invention will be explained.

The cleaning liquid composition of the present invention is a cleaning liquid composition for cleaning a substrate having Cu wiring. In another embodiment, the cleaning liquid composition of the present invention is a cleaning liquid composition for cleaning a substrate of a semiconductor device, wherein the barrier metal of the substrate having Cu wiring is made of Co.

The cleaning liquid composition of the present invention comprises one or more basic compounds, and one or more nitrogen-containing heterocyclic monocyclic aromatic compounds having one or more carboxyl groups or ester groups, but having only amino groups directly bonded to the nitrogen-containing heterocyclic ring when having one or more amino groups, and said composition has a hydrogen ion concentration (pH) of 8 to 12.

The basic compound used in the present invention is not particularly limited as long as it can adjust the pH to a predetermined value.

When the cleaning liquid composition of the present invention is used particularly for electronic devices or the like, the basic compound is preferably a basic compound containing no metal ion. The reason is, for example, that when the basic compound contains metal ions, reverse contamination and diffusion to the inside of the substrate occur, which causes an increase in leak current due to insulation failure of the interlayer insulating film, and deterioration of semiconductor characteristics. In addition, when the basic compound contains no metal ion, there is an advantage that the resistivity can be more strictly controlled in circuit board production and the like.

The content of the basic compound is not particularly limited because of its role of adjusting the pH which varies depending on the type of the basic compound and the type and contents of other components, but the content at the time of use is preferably 0.5 to 50 mmol/L, particularly preferably 0.5 to 30 mmol/L, and even more preferably 0.5 to 20 mmol/L. When the content of the basic compound is lower than the above range, the pH may change due to slight variation in composition or contamination of impurities, and when the content of the basic compound is higher than the above range, damage to the low-dielectric-constant interlayer insulating film (low-k) material introduced with the miniaturization of wiring may be increased.

Examples of basic compounds include, but are not limited to, quaternary ammonium compounds, amines, etc.

Examples of quaternary ammonium compounds include, but are not limited to, tetramethylammonium hydroxide (TMAH), trimethyl-2-hydroxyethyl ammonium hydroxide (choline), tetraethylammonium hydroxide, tetrapropylammonium hydroxide, tetrabutylammonium hydroxide, trimethylphenylammonium hydroxide, benzyltrimethylammonium hydroxide, etc.

Preferably, it is choline and tetraethylammonium hydroxide, and more preferably it is choline and tetraethylammonium hydroxide.

In one embodiment, the cleaning liquid composition of the present invention does not contain tetramethylammonium hydroxide (TMAH), which is a quaternary ammonium compound. Among the quaternary ammonium compounds, tetramethylammonium hydroxide is highly toxic and tends to be more discouraged by manufacturers concerned about the health effects on workers in manufacturing processes in recent years, so it is preferable not to contain TMAH as much as possible.

Examples of amines include, from the viewpoint of the number of nitrogen atoms of the amine present in a molecule, monoamines having one nitrogen atom, diamines having two nitrogen atoms, triamines having three nitrogen atoms, and polyamines having four or more nitrogen atoms. In addition, examples of amines include, from the viewpoint of the number of hydrogen atoms of ammonia ($NH_3$) which are substituted with hydrocarbon groups that may have a substituent, primary amines, secondary amines and tertiary amines.

These amines include, but are not limited to, primary aliphatic amines, secondary aliphatic amines, tertiary aliphatic amines, alicyclic amines, aromatic amines, heterocyclic amines, etc. Among them, from the viewpoint of easy availability and suppression of raw material cost, primary aliphatic amines, secondary aliphatic amines, tertiary aliphatic amines, and heterocyclic amines are preferable, and primary aliphatic amines, secondary aliphatic amines, and tertiary aliphatic amines are more preferable. The amines also include alkanolamines and diamines, etc.

Primary aliphatic amines, secondary aliphatic amines and tertiary aliphatic amines include, but are not limited to, alkylamines, alkanolamines, diamines and triamines, etc.

Examples of primary aliphatic amines include, but are not limited to, those having 1 to 10 carbon atoms, which may be linear or branched; and specifically, monoethanolamine, ethylenediamine, 2-(2-aminoethoxyethanol), 2-(2-aminoethylamino)ethanol, diethylenetriamine, triethylenetetramine, etc. Among them, monoethanolamine, 2-(2-aminoethoxyethanol) and 2-(2-aminoethylamino)ethanol are preferable from the viewpoint of easy availability and suppression of raw material cost.

Examples of secondary aliphatic amines include, but are not limited to, those having 1 to 10 carbon atoms, which may be linear or branched, and specifically, diethanolamine, N-methylaminoethanol, N-hydroxyethylaminoethanol, dipropylamine, 2-ethylaminoethanol, etc. Among them, diethanolamine and N-methylaminoethanol are preferable from the viewpoint of easy availability and suppression of raw material cost.

Examples of tertiary aliphatic amines include, but are not limited to, those having 1 to 10 carbon atoms, which may be linear or branched, and specifically, triethanolamine, dimethylaminoethanol and ethyl diethanolamine, etc. Among them, triethanolamine is preferable from the viewpoint of easy availability and suppression of raw material cost.

Examples of alicyclic amines include, but are not limited to, those having 3 to 10 carbon atoms, and specifically, cyclopentylamine, cyclohexylamine, etc. Among them, cyclohexylamine is preferable from the viewpoint of easy availability and suppression of raw material cost.

Examples of aromatic amines include, but are not limited to, those having 6 to 10 carbon atoms, and specifically, aniline and 4-aminophenol, etc. Among them, 4-aminophenol is preferable from the viewpoint of easy availability and suppression of raw material cost.

Examples of heterocyclic amines include, but are not limited to, those having 4 to 10 carbon atoms, and specifically, piperidine, piperazine, N-aminoethyl piperazine, N-hydroxyethyl piperazine, N-methyl-N'-hydroxyethyl piperazine, N-aminoethyl piperazine, N,N'-dimethylaminoethyl methylpiperazine, 1-(2-dimethylaminoethyl)-4-methylpiperazine, morpholine, N-methylmorpholine, N-hydroxyethyl morpholine, N-aminoethyl morpholine, etc. Among them, morpholine, piperidine, piperazine, N-aminohydroxyethyl piperazine, N-aminoethyl piperazine and 1-(2-dimethylaminoethyl)-4-methylpiperazine are preferable, from the viewpoint of easy availability and suppression of raw material cost.

The basic compound may cause damage to low-k materials due to its molecular structure. In particular, the use of primary amines often causes damage to low-k materials. Therefore, the basic compound is preferably a secondary amine, a tertiary amine or a quaternary ammonium compound.

Furthermore, among the amines, some compounds of alicyclic amines, aromatic amines and heterocyclic amines having a cyclic structure in the molecule may be strongly adsorbed on the surface of Cu and become foreign substances; therefore linear aliphatic amines are preferred. It is also preferable to use a quaternary ammonium compound for the same reason. Moreover, examples of the linear aliphatic amine include, but are not limited to, alkanolamine, diamine, triamine, tetramine, etc. Among them, alkanolamine is preferable from the viewpoint of easy availability and suppression of raw material cost.

Furthermore, some compounds of primary amines or secondary amines have a high complex stability constant with Cu and form a water-soluble complex, so they tends to dissolve Cu. Therefore, in this respect, the amine is preferably alkanolamine having 1 to 10 carbon atoms, more preferably diethanolamine of a secondary aliphatic amine and triethanolamine of a tertiary aliphatic amine, and particularly preferably triethanolamine.

The cleaning liquid composition of the present invention comprises a nitrogen-containing heterocyclic monocyclic aromatic compound having one or more carboxyl groups or ester groups, but having only amino groups directly bonded to the nitrogen-containing heterocyclic ring when having one or more amino groups (hereinafter, simply referred to as "nitrogen-containing heterocyclic monocyclic aromatic compound having one or more carboxyl groups or ester groups"). When the compound has an amino group that is not directly bonded to the nitrogen-containing heterocyclic ring, damage to the barrier metal that is less noble than Cu is a concern, and the requirement as a cleaning liquid for state-of-the-art semiconductor substrates having a barrier metal layer may not be satisfied.

The nitrogen-containing heterocyclic monocyclic aromatic compound having one or more carboxyl groups or ester groups is added in order to remove organic residues on the substrate surface.

The content of the nitrogen-containing heterocyclic monocyclic aromatic compound having one or more carboxyl groups or ester groups is not particularly limited because it varies depending on the type of the compound, the type and content of other components; the content at the time of use is preferably 0.1 to 10 mmol/L, particularly preferably 0.1 to 5 mmol/L, and even more preferably 0.1 to 2 mmol/L. When the content of the nitrogen-containing heterocyclic monocyclic aromatic compound having one or more carboxyl groups or ester groups is lower than the above range, the removability of organic residue is low; and when the content of the nitrogen-containing heterocyclic monocyclic aromatic compound having one or more carboxyl groups or ester groups is higher than the above range, damage to Cu may be increased.

The nitrogen-containing heterocyclic ring of a nitrogen-containing heterocyclic monocyclic aromatic compound having one or more carboxyl groups or ester groups is not particularly limited, but is preferably a 5-membered ring or a 6-membered ring, and a 5-membered ring is more preferred. Compounds with less than or equal to 4-membered ring are difficult to apply, because few such compounds are manufactured industrially at low cost, and there are concerns about rising cost of raw materials and securing quality stability. Many of the compounds with equal to or more than 7-membered ring have low solubility in water and many are unstable in aqueous solution even if dissolved, and similar to the compounds with less than or equal to 4-membered ring, few such compounds are manufactured industrially at low cost, and there are concerns about rising cost of raw materials and securing quality stability; therefore, they are also difficult to apply.

In addition, the number of nitrogen atoms contained in the nitrogen-containing heterocyclic ring constituting the nitrogen-containing heterocyclic monocyclic aromatic compound having one or more carboxyl groups or ester groups is not particularly limited, but preferably, it may be two or more.

Among the nitrogen-containing heterocyclic rings constituting the nitrogen-containing heterocyclic monocyclic aromatic compound having one or more carboxyl groups or ester groups, examples of preferred 5-membered nitrogen-containing heterocyclic rings include, but are not limited to, pyrrole ring, pyrazoline ring, pyrazole ring, imidazole ring, triazole ring, imidazoline ring, oxazoline ring, oxazole ring, isoxazole ring and tetrazole ring; among them, pyrazole ring, imidazole ring, triazole ring and tetrazole ring are more preferred. Examples of preferred 6-membered nitrogen-containing heterocyclic rings include, but are not limited to, piperidine ring, pyridine ring, pyrazine ring, piperazine ring, pyrimidine ring, pyridazine ring and morpholine ring.

The nitrogen-containing heterocyclic monocyclic aromatic compound having one or more carboxyl groups or ester groups may be a compound in which a carboxyl group or an ester group is directly substituted on a nitrogen-containing heterocyclic ring, and it may be a compound in which a substituent having a carboxyl group or an ester group (for example, an alkyl group, alkenyl group or ether group in which a carboxyl group or an ester group is substituted) is substituted on a nitrogen-containing heterocyclic ring.

Here, as the carboxyl group and the substituent having a carboxyl group to be substituted on the nitrogen-containing heterocyclic ring, it is preferably a carboxyl group, a substituent in which a carboxyl group is substituted on an alkyl group having 1 to 5 carbon atoms, and a substituent in which a carboxyl group is substituted on an alkenyl group having 2 to 5 carbon atoms; more preferably it is a carboxyl group, a substituent in which a carboxyl group is substituted on an alkyl group having 1 to 3 carbon atoms, and a substituent in which a carboxyl group is substituted on an alkenyl group having 2 to 3 carbon atoms; and most preferably it is a carboxyl group. Here, the above-mentioned substituents having a carboxyl group do not have an amino group.

Furthermore, as the ester group and the substituent having an ester group to be substituted on the nitrogen-containing heterocyclic ring, it is preferably a methoxycarbonyl group, an ethoxycarbonyl group, an n-propoxycarbonyl group, a substituent in which any of the above-mentioned ester group is substituted on an alkyl group having 1 to 5 carbon atoms, and a substituent in which any of the above-mentioned ester group is substituted on an alkenyl group having 2 to 5 carbon atoms; and it is more preferably a methoxycarbonyl group, and a substituent in which a methoxycarbonyl group is substituted on an alkyl group having 1 to 3 carbon atoms, and a substituent in which a methoxycarbonyl group is substituted on an alkenyl group having 2 to 3 carbon atoms; and most preferably it is a methoxycarbonyl group. Here, the above-mentioned substituents having an ester group do not have an amino group.

The number of carboxyl groups and ester groups contained in the nitrogen-containing heterocyclic monocyclic aromatic compound having one or more carboxyl groups or ester groups is not particularly limited, but is preferably 1 to 3, and more preferably 1 or 2, and 2 is particularly preferred; and it is most preferred that all of these be carboxyl groups.

In addition, the nitrogen-containing heterocyclic monocyclic aromatic compound having one or more carboxyl groups or ester groups may have an amino group directly bonded to the nitrogen-containing heterocyclic ring. The number of amino groups in said compound is not particularly limited, but it is preferably 0, 1 or 2, and more preferably 0 or 1.

The nitrogen-containing heterocyclic monocyclic aromatic compound having one or more carboxyl groups or ester groups is preferably a compound represented by the following general formula (A).

[Chemical formula 2]

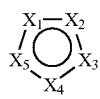
(A)

wherein
$X_1$ to $X_5$ are, each independently of one another, $CR_1$, $CR_1R_2$, N, $NR_1$, O or S, provided that at least two of $X_1$ to $X_5$ are N or $NR_1$,
$R_1$ and $R_2$ are, when a plurality of them are present, each independently of one another, a hydrogen atom or a substituent, provided that at least one of R1 and R2 present in the general formula (A) has a carboxyl group, a substituent having a carboxyl group, an ester group, or a substituent having an ester group. Here, the above-mentioned substituent having a carboxyl group and the substituent having an ester group do not have an amino group.

In the above general formula (A), preferably, two to three of $X_1$ to $X_5$ are, each independently of one another, N or $NR_1$, and the rest are each independently of one another, O, $CR_1$ or $CR_1R_2$. More preferably, two of $X_1$ to $X_5$ are each independently of one another, N or $NR_1$, and the remaining three are each independently of one another, O, $CR_1$ or $CR_1R_2$. Furthermore, particularly preferably, two of $X_1$ to $X_5$ are each independently of one another, N or $NR_1$, and the remaining three are each independently of one another, $CR_1$ or $CR_1R_2$.

It is preferable that $R_1$ and $R_2$ which are bonded to nitrogen atoms are both hydrogen atoms.

At least one of $R_1$ and $R_2$ bonded to a carbon atom is preferably a carboxyl group, a substituent having a carboxyl group, an ester group or a substituent having an ester group. The substituent having a carboxyl group and the substituent having an ester group do not have an amino group. Furthermore, at least one of $R_1$ and $R_2$ may be an amino group. The other $R_1$ and $R_2$ bonded to nitrogen atoms are each independently of one another, preferably, a hydrogen atom, an alkyl group having 1 to 3 carbon atoms, an alkenyl group having 2 to 3 carbon atoms, a hydroxyalkyl group having 1 to 3 carbon atoms, or a hydroxyl group, and more preferably, all are hydrogen atoms.

Preferred embodiments of the carboxyl group, the substituent having a carboxyl group, the ester group, and the substituent having an ester group are as described above.

As the compounds represented by the above general formula (A), it is preferably a 4-substituted imidazole compound in which $X_1$ is NH, $X_2$ is CH, $X_3$ is N, $X_4$ is $CR_1$, and $X_5$ is CH; a 2-substituted imidazole compound in which $X_1$ is NH, $X_2$ is $CR_1$, $X_3$ is N, $X_4$ is CH, and $X_5$ is CH; a 2,4-disubstituted imidazole compound in which $X_1$ is NH, $X_2$ is $CR_1$, $X_3$ is N, $X_4$ is $CR_1$, and $X_5$ is CH; a 4,5-disubstituted imidazole compound in which $X_1$ is NH, $X_2$ is CH, $X_3$ is N, $X_4$ is $CR_1$, and $X_5$ is $CR_1$; a 4-substituted pyrazole compound in which $X_1$ is NH, $X_2$ is N, $X_3$ is CH, $X_4$ is $CR_1$, and $X_5$ is CH; a 3-substituted pyrazole compound in which $X_1$ is NH, $X_2$ is N, $X_3$ is $CR_1$, $X_4$ is CH, and $X_5$ is CH; a 3,5-disubstituted pyrazole compound in which $X_1$ is NH, $X_2$ is N, $X_3$ is $CR_1$, $X_4$ is CH, and $X_5$ is $CR_1$; a 4,5-disubstituted pyrazole compound in which $X_1$ is NH, $X_2$ is N, $X_3$ is CH, $X_4$ is $CR_1$ and $X_5$ is $CR_1$; a 3-substituted-1,2,4-triazole compound in which $X_1$ is NH, $X_2$ is N, $X_3$ is $CR_1$, $X_4$ is N, and $X_5$ is CH; a 3,5-disubstituted-1,2,4-triazole compound in which $X_1$ is NH, $X_2$ is N, $X_3$ is $CR_1$, $X_4$ is N, and $X_5$ is $CR_1$; or a substituted tetrazole compound in which $X_1$ is NH, $X_2$ is N, $X_3$ is N, $X_4$ is N, and $X_5$ is $CR_1$. As examples of more preferred embodiments of these preferred compounds, examples of 4-substituted imidazole compound include imidazole-4-carboxylic acid, imidazole-4-acetic acid and trans-urocanic acid, examples of 2-substituted imidazole compound include imidazole-2-carboxylic acid, examples of 2,4-disubstituted imidazole compound include imidazole-2,4-dicarboxylic acid, examples of 4,5-disubstituted imidazole compound include imidazole-4,5-dicarboxylic acid, examples of 4-substituted pyrazole compound include pyrazole-4-carboxylic acid, examples of 3-substituted pyrazole compound include pyrazole-3-carboxylic acid, examples of 3,5-disubstituted pyrazole compound include pyrazole-3,5-dicarboxylic acid, examples of 4,5-disubstituted pyrazole compound include pyrazole-4,5-dicarboxylic acid, examples of substituted-1,2,4-triazole compound include 1,2,4-triazole-3-carboxylic acid and methyl 1,2,4-triazole-3-carboxylate, examples of 3,5-disubstituted-1,2,4-triazole compound include 3-amino-1,2,4-triazole-5-carboxylic acid, and examples of substituted tetrazole compound include tetrazole-5-acetic acid. Among these, urocanic acid, pyrazole-4-carboxylic acid, 3,5-pyrazole dicarboxylic acid and imidazole-4,5-dicarboxylic acid are particularly preferred, and pyrazole-3,5-dicarboxylic acid and imidazole-4,5-dicarboxylic acid are most preferred.

Examples of the organic residue include, but are not limited to, an organic residue containing Cu, which is a dimer or an oligomer of an organometallic complex formed by crosslinking Cu and an organic anticorrosive agent such as benzotriazole (BTA) via the Cu formed from a reaction during CMP process, and it is poorly soluble. In order to dissolve this organic residue containing Cu in a cleaning liquid, there is a method of breaking the coordination bond between Cu and the organic anticorrosive agent by changing the pH of the cleaning liquid to decrease the molecular weight.

Among the organic residues containing Cu, examples of the dimer or oligomer of an organometallic complex formed by crosslinking Cu and an organic anticorrosive agent such as benzotriazole (BTA) via the Cu formed from a reaction during CMP process include, but are not limited to, Cu-benzotriazole (BTA) complex.

The Cu-BTA complex refers to a complex of Cu and benzotriazole (BTA) formed by crosslinking or the like, and examples thereof include, but are not limited to, Cu-BTA complex, a compound in which a Cu-BTA complex is mixed with a slurry-derived inorganic material such as $SiO_2$, etc. When the pH is 2 or less or 11 or more, the Cu-BTA complex cannot keep the complex stable and its molecular weight is decreased, so it can be dissolved in a cleaning liquid (see FIG. 1). However, as described above, when the pH is 2 or less, Cu corrodes or metal Cu is exposed after treatment, and oxidation proceeds significantly in the air, and when the pH exceeds 12, there occurs a concern of damage to low-k materials and Si. Therefore, removal of organic residues by changing pH is not applicable. Accordingly, a complexing agent having a complex stability constant higher than that of Cu and BTA, a relatively small hydrophobic site in the molecule, and a high water solubility is added to newly form an organometallic complex of Cu and the complexing agent, thereby enabling to remove organic residues such as Cu-BTA complex in the pH range of 8 to 12.

This novel organometallic complex of Cu and a complexing agent dissolves in a cleaning liquid because the proportion of hydrophobic sites is small compared to the Cu-BTA complex. As this complexing agent, a nitrogen-containing heterocyclic monocyclic aromatic compound having one or more carboxyl groups or ester groups is used.

In the present invention, the pH of the cleaning liquid composition is 8 to 12, preferably 10 to 12.

The substrate having Cu wiring in the present invention is not particularly limited as long as it is a substrate obtained after chemical mechanical polishing (CMP), and examples include a substrate immediately after CMP, and a substrate immediately after processing the upper insulation film by dry etching after formation of Cu wiring. Among these, preferably, it is a substrate immediately after CMP.

Examples of Cu wiring in the present invention include, but are not limited to, metal Cu wiring, Cu alloy wiring, and laminated wiring of Cu and a Cu alloy and another metal film, etc.

The substrate having Cu wiring in the present invention may be the one having Cu wiring formed on low-k, or may further have a barrier metal layer between low-k and Cu wiring.

The chemical mechanical polishing (CMP) in the present invention can be carried out according to known chemical mechanical polishing, and examples include, but are not limited to, a polishing method using abrasive grains such as $SiO_2$ and $Al_2O_3$, and an abrasive-free polishing method using electrolytic water, etc. Among these, a polishing method using abrasive grains such as $SiO_2$ and $Al_2O_3$ is preferable.

One of the major features of the cleaning liquid composition of the present invention is the ability to remove fine particles without using a surfactant. The reason of this ability is as follows: in the basic region the charge on the surface of an oxide such as $SiO_2$ changes, which is used to control the charge on both the substrate and fine particles to be negative, thereby enabling to separate the substrate and the fine particles due to electrostatic repulsion effect. For example, the removability of fine particles derived from Cu, such as Cu-BTA fine particles, can be evaluated by measuring the surface potential (zeta potential) of Cu spherical powder. When the zeta potential is a negative value of large absolute value, the fine particles are greatly negatively charged, so the electrostatic repulsive force against the substrate is large, and a force to separate the fine particles from the substrate is large.

However, conventional basic cleaning liquids cannot sufficiently remove metal impurities on the substrate surface. The reason is considered to be that, in the basic region, metal impurities react with hydroxide ions ($OH^-$) and adsorbed on the substrate surface as hydroxides or hydroxyl complexes, so they do not dissolve in a liquid.

When the pH of a cleaning liquid is decreased, its removability of metal impurities is improved, but the removability of fine particles is lowered and the damage to Cu applied to the substrate surface tends to increase. In addition, conversely, when the pH of a cleaning liquid is increased, its removability of fine particles is improved, but the removability of metal impurities is lowered, and damage to SiOC-based low-k materials that are fragile in the basic region and to Si tends to increase.

According to the present invention, by setting the pH of the cleaning liquid composition to 8 to 12, both fine particles and metal impurities are removed, and cleaning can be performed without damaging Cu and both the barrier metal and low-k material.

Furthermore, in this pH range, in the cleaning after Cu-CMP, a thin $Cu_2O$ layer can be formed on the surface of Cu after the cleaning, and rapid oxidation of the surface when left in the air can be suppressed. In the aqueous system, at the pH of the acidic region, since Cu is in the state of $Cu^{2+}$ or CuO, it is in a state of high activity and is likely to be rapidly oxidized; but in the alkaline region, it is in the state of CuO or $Cu_2O$ (see FIG. 2). Therefore, at the pH of the acidic region, a non-uniform oxidation reaction progresses on the Cu surface after CMP, and a non-uniform oxide film covers the surface and surface roughness increases. On the other hand, at pH 8 to 12, since a thin $Cu_2O$ layer can be formed, and this layer functions as a protective film on the Cu surface and suppresses rapid oxidation of the Cu surface after CMP, cleaning with excellent flatness can be realized.

Similarly, in the aqueous system, at the pH of the acidic region, Co is in the state of $Co^{2+}$, and thus it is in a high activity state and susceptible to rapid oxidation, but in the alkaline region, it is in the state of CoO (see FIG. 3). Therefore, at the pH of the acidic region, the non-uniform oxidation reaction proceeds on the Co surface after CMP, and the surface roughness increases. On the other hand, at pH 8 to 12, since a thin CoO layer can be formed, this layer functions as a protective film of the Co surface, and for example, even when a state-of-the-art semiconductor substrate having a Co layer as a barrier metal layer is used, rapid oxidation of the Co surface after CMP is suppressed, and cleaning with less damage to the barrier metal becomes possible.

The cleaning liquid composition of the present invention does not contain isoascorbic acid, ascorbic acid or gallic acid. Coexistence of these compounds not only causes a reduction in the removability of metal impurities, but also causes, in the case of isoascorbic acid or ascorbic acid, a concern to the stability of the composition due to decomposition.

Furthermore, the cleaning liquid composition of the present invention may contain one or more phosphonic acid chelating agents in order to improve removability of metal impurities and fine particles.

The phosphonic acid chelating agent is not particularly limited as long as it has a phosphonic acid-derived structure, and examples include N,N,N',N'-ethylenediamine tetrakis (methylenephosphonic acid) (EDTPO), glycine-N,N-bis (methylenephosphonic acid) (glyphosine), nitrilotris (methylene phosphonic acid) (NTMP), or salts thereof, etc. These phosphonic acid chelating agents are excellent in removability of metal impurities (particularly, Fe and Zn) in the pH range of 8 to 12, and also have the effect of improving removability of fine particles on the Cu surface after CMP.

The content of the phosphonic acid chelating agent is not particularly limited, and from the viewpoint of removability of metal impurities and fine particles, its concentration at the time of using the cleaning liquid composition is preferably 0.005 mM to 0.1 mM.

In addition, the cleaning liquid composition of the present invention may contain a surfactant to improve removability of fine particles. The type of surfactant is appropriately selected depending on the fine particles to be removed and the substrate, and is preferably a water-soluble anionic or nonionic type, but not limited thereto. However, in the case of nonionic type, the attack on low-k may be increased depending on the number and ratio of ethylene oxide and propylene oxide in the structure, etc, and therefore care should be taken in the selection.

Furthermore, the cleaning liquid composition of the present invention may contain an amino acid in order to improve removability of Cu-derived contaminants without dissolving Co, etc. The type of amino acid is appropriately selected depending on the state of Cu surface after CMP step, and is preferably arginine and glycine, but not limited thereto. However, since the effect of amino acid varies depending on the pH of other coexisting compounds and compositions, care should be taken in the selection.

The stock solution composition of the present invention is the one which is diluted to provide a cleaning liquid composition of the present invention, and by diluting the stock solution composition, for example 10 times or more, preferably 10 to 1000 times, more preferably 50 to 200 times, but not limited thereto, the cleaning liquid composition of the present invention can be obtained; the dilution ratio can be appropriately determined depending on the composition.

The cleaning liquid composition of the present invention is mainly composed of water; therefore, when a dilution/mixing apparatus is installed in the manufacturing line of electronic devices, it is supplied as a stock solution composition, which is diluted with a diluting solution including water immediately before use (said diluting solution includes those consisting of only ultrapure water), so that said present composition also has the advantage of contributing to the reduction of transportation cost, reduction of carbon dioxide gas during transportation, and reduction of manufacturing cost at electronic device manufacturers.

The cleaning liquid composition of the present invention is suitable for, for example, a substrate having Cu wiring, and in particular a substrate after chemical mechanical polishing (CMP). On the substrate surface after CMP, there may be fine particles and metal impurities contained in the slurry, in addition to materials for various wirings and for barrier metals (Co, Ti-based compounds, Ta-based compounds, Ru, etc.) as well as insulating film materials ($SiO_2$, low-k). The fine particles are, for example, mainly alumina, silica and cerium oxide, etc, and the metal impurities include Cu that is dissolved in the slurry and redeposited during polishing, Fe derived from an oxidizing agent in the slurry, and Cu organometallic complex formed by reacting a Cu anticorrosive agent contained in the slurry and Cu, etc.

In the present invention, the barrier metal is Co, Ti-based compound, Ta-based compound, Ru, etc., which is used for a layer (barrier metal layer) formed between Cu wiring of a semiconductor substrate and an insulating film in order to prevent Cu in the wiring from diffusing into the insulating film. As the barrier metal, Co is preferred.

In addition, the low-k material is a material having a low dielectric constant used for an interlayer insulating film and the like, and examples include, but are not limited to, porous silicon, silicon-containing organic polymer, TEOS (tetra-ethoxysilane), etc. Specifically, Black Diamond (Applied Materials, Inc.), Aurora (ASM International) and the like can be mentioned.

In addition, the cleaning liquid composition of the present invention may contain components other than those mentioned above.

Such components include, for example, aprotic polar organic solvents such as N-methyl-2-pyrrolidinone, N,N-dimethylacetamide, dimethyl sulfoxide; protic organic solvents such as lower alcohols, aromatic alcohols and glycols; sugars such as glucose; sugar alcohols such as D-sorbitol; inorganic acids such as sulfuric acid and phosphoric acid; carboxylic acids such as oxalic acid and citric acid; and sulfonic acids such as methanesulfonic acid, etc. One or more of them can be used in combination.

Next, a method of manufacturing a semiconductor substrate according to the present invention will be explained.

The method of manufacturing a semiconductor substrate according to the present invention is a method of manufacturing a semiconductor substrate, comprising a step of bringing the cleaning liquid composition according to the present invention into contact with a substrate having Cu wiring.

In addition, the method of manufacturing a semiconductor substrate according to the present invention is a method of manufacturing a semiconductor substrate, comprising a step of chemical mechanical polishing (CMP) a substrate having Cu wiring prior to the step of bringing the cleaning liquid composition into contact with the substrate having Cu wiring.

The step of contacting includes, but is not limited to, for example, a cleaning step after CMP, and a cleaning step after processing of an insulating film of a Cu-wiring upper layer by dry etching. The method for contacting includes, but is not limited to, for example, a single wafer cleaning method combined with brush scrub, a single wafer cleaning method in which cleaning liquid is sprayed from spray or nozzle, a batch spray cleaning method, and a batch immersion cleaning method. Among them, the single wafer cleaning method combined with brush scrub and the single wafer cleaning method in which the cleaning liquid is sprayed from spray or nozzle are preferable, and the single wafer cleaning method combined with brush scrub is particularly preferable.

The atmosphere for contacting includes, but is not limited to, for example, in the air, in a nitrogen atmosphere and in vacuum. Among these, in the air and in a nitrogen atmosphere are preferable.

The contact time is appropriately selected in accordance with the purpose, and is not particularly limited; in the case of single wafer cleaning method combined with brush scrub and single wafer cleaning method in which cleaning liquid is sprayed from spray or nozzle, it is 0.5 to 5 minutes, and in the case of batch spray cleaning method and batch immersion cleaning method, it is 0.5 to 30 minutes.

The temperature is appropriately selected in accordance with the purpose, and is not particularly limited; in the case of single wafer cleaning method combined with brush scrub and single wafer cleaning method in which cleaning liquid is sprayed from spray or nozzle, it is 20° C. to 50° C., and in the case of batch spray cleaning method and batch immersion cleaning method, it is 20° C. to 100° C.

Examples of the semiconductor substrate include, but are not limited to, silicon, silicon carbide, silicon nitride, gallium arsenide, gallium nitride, gallium phosphorus, indium phosphorus, etc. Among these, preferred are silicon, silicon carbide, gallium arsenide and gallium nitride, and particularly preferred are silicon and silicon carbide.

The above-mentioned contact conditions can be combined appropriately in accordance with the purpose.

Next, the method of dissolving an organic residue containing Cu according to the present invention will be explained.

The method of dissolving an organic residue containing Cu of the present invention comprises a step of bringing the cleaning liquid composition that comprises one or more basic compounds and one or more nitrogen-containing heterocyclic monocyclic aromatic compounds and that has a hydrogen ion concentration (pH) of 8 to 12, in contact with an organic residue containing Cu.

The cleaning liquid composition is not particularly limited as long as it is the one described above, and the cleaning liquid composition of the present invention described in detail can be used.

Examples of the method of contacting are not particularly limited, as long as they are those described above.

EXAMPLES

Next, the present invention will be explained in more detail regarding the cleaning liquid composition of the present invention, by way of examples and comparative examples described below, but the present invention is not limited thereto.

In the examples and comparative examples of the cleaning liquid compositions shown in Tables 1 to 5, the content (mM) indicates the content (concentration) in the cleaning liquid composition in each example or comparative example.

<Evaluation 1: Removability of Organic Residue (Cu-BTA Removability)>

An 8-inch silicon wafer with Cu film formed on the surface by electrolytic plating was cut into 1.5×1.5 cm$^2$, immersed in a polyethylene container containing 48 mL of BTA aqueous solution (concentration 10 mM, pH 8) at 30° C. for 5 minutes without stirring, to form a Cu-BTA complex layer on the Cu surface, then it was subjected to ultrapure water rinse for 1 minute, and dried by nitrogen blow. The wafer was immersed in a polyethylene container containing 48 mL of each cleaning liquid composition at 30° C. for 5 minutes without stirring, again subjected to ultrapure water rinse for 1 minute, and dried by nitrogen blow. Subsequently, the wafer was immersed in a polyethylene container containing 48 mL of an aqueous corrosion solution (1 mM of nitrilotriacetic acid+50 mM of triethanolamine) at 30° C. for 2 minutes without stirring, then the wafer was taken out, and the Cu concentration in the aqueous corrosion solution was analyzed by ICP-MS (inductively coupled plasma-mass spectrometer). The higher the concentration of Cu in the aqueous corrosion solution, the less the Cu-BTA complex formed as a protective film on the Cu surface, and the organic residue removability of the cleaning liquid composition used for the treatment before the aqueous corrosion solution was judged to be high. Tables 1 to 3 show the composition and results of the cleaning liquid compositions.

Examples 1 to 15, Comparative Examples 1 to 11

Evaluation of the removability of organic residue (Evaluation 1) was carried out for the cleaning liquid compositions of the present invention containing the following nitrogen-containing heterocyclic monocyclic aromatic compounds that have no amino group and have one or more carboxyl groups or ester groups, but that have only amino groups directly bonded to the nitrogen-containing heterocyclic ring when having one or more amino groups: trans-urocanic acid (Urc) (Example 1), pyrazole-3,5-dicarboxylic acid (PDC) (Example 2), pyrazole-3-carboxylic acid (3-PCA) Example 3), imidazole-4-carboxylic acid (ImCA) (Example 4), imidazole-4,5-dicarboxylic acid (ImDC) (Examples 5, 8, 11 to 13), methyl 1,2,4-triazole-3-carboxylate (TAZCA) (Examples 6 and 9) or 3-amino-1,2,4-triazole-5-carboxylic acid (ATAZ-5CA) (Examples 7, 10, 14, 15).

In addition, as comparative examples, evaluation of the removability of organic residue (Evaluation 1) was carried out for the case of no cleaning with a cleaning liquid composition (no cleaning) (comparative example 1), for a cleaning liquid composition using only alkali (choline) to adjust pH without containing a cleaning component (comparative examples 2 and 8), and for cleaning liquid compositions of each pH containing the following: L-histidine (His) (comparative example 3), histamine (Him) (comparative example 4), pyrazole (Pyz) (comparative example 5), 3-amino-5-hydroxypyrazole (AHP) (comparative example 6), 4-(hydroxymethyl)imidazole hydrochloride (Im-OH) (comparative example 7), or monoethanolamine (MEA) (comparative examples 9 to 11).

In Evaluation 1, the higher the concentration of Cu in the aqueous corrosion solution, the less the Cu-BTA complex formed as a protective film on the Cu surface, and the organic residue removability of the cleaning liquid composition used for the treatment before the aqueous corrosion solution was judged to be high. In Tables 1 and 2, using the organic residue removability when treated with choline as the standard, those showing higher removability than choline are indicated as ○ those showing more superior removability are indicated as ◎, and those showing lower removability than choline are indicated as x. In Table 3, using the organic residue removability when treated with monoethanolamine as the standard, those showing higher removability than monoethanolamine are indicated as ○ those showing more superior removability are indicated as ◎, and those showing lower removability than monoethanolamine are indicated as x.

TABLE 1

| | | Cu-BTA removability | | | |
|---|---|---|---|---|---|
| | Compound | | Content/ mM | Basic compound | pH | Cu-BTA removability* |
| Com. ex. 1 | No cleaning | | | | | X |
| Com. ex. 2 | Choline | choline | | Choline | 12 | — |

TABLE 1-continued

Cu-BTA removability

| | Compound | | Content/ mM | Basic compound | pH | Cu-BTA removability* |
|---|---|---|---|---|---|---|
| Com. ex. 3 | L-histidine | His | 0.1 | Choline | 12 | ○ |
| Com. ex. 4 | Histamine | Him | 0.02 | Choline | 12 | ○ |
| Com. ex. 5 | Pyrazole | Pyz | 0.1 | Choline | 12 | X |
| Com. ex. 6 | 3-Amino-5-hydroxypyrazole | AHP | 0.1 | Choline | 12 | X |
| Com. ex. 7 | 4-(Hydroxymethyl)imidazole hydrochloride | Im-OH | 0.05 | Choline | 12 | X |
| Ex. 1 | trans-Urocanic acid | Urc | 0.1 | Choline | 12 | ○ |
| Ex. 2 | Pyrazole-3,5-dicarboxylic acid | PDC | 0.1 | Choline | 12 | ◎ |
| Ex. 3 | Pyrazole-3-carboxylic acid | 3-PCA | 0.1 | Choline | 12 | ○ |
| Ex. 4 | Imidazole-4-carboxylic acid | ImCA | 0.1 | Choline | 12 | ○ |
| Ex. 5 | Imidazole-4,5-dicarboxylic acid | ImDC | 0.1 | Choline | 12 | ◎ |
| Ex. 6 | Methyl 1,2,4-triazole-3-carboxylate | TAZCA | 0.1 | Choline | 12 | ○ |
| Ex. 7 | 3-Amino-1,2,4-triazole-5-carboxylic acid | ATAZ-5CA | 0.1 | Choline | 12 | ○ |

*Removability by choline (pH 12) as the standard

TABLE 2

Cu-BTA removability

| | Compound | | Content/ mM | Basic compound | pH | Cu-BTA removability* |
|---|---|---|---|---|---|---|
| Com. ex. 8 | Choline | choline | | Choline | 11.5 | — |
| Ex. 8 | Imidazole-4,5-dicarboxylic acid | ImDC | 0.1 | Choline | 11.5 | ○ |
| Ex. 9 | Methyl 1,2,4-triazole-3-carboxylate | TAZCA | 0.1 | Choline | 11.5 | ○ |
| Ex. 10 | 3-Amino-1,2,4-triazole-5-carboxylic acid | ATAZ-5CA | 0.1 | Choline | 11.5 | ○ |

*Removability by choline (pH 11.5) as the standard

TABLE 3

Cu-BTA removability

| | Compound | | Content/ mM | Basic compound | pH adjuster | pH | Cu-BTA removability* |
|---|---|---|---|---|---|---|---|
| Com. ex. 9 | Monoethanolamine | MEA | 2.0 | | Hydrochloric acid | 10 | — |
| Com. ex. 10 | Monoethanolamine | MEA | 2.0 | | Hydrochloric acid | 9 | — |
| Com. ex. 11 | Monoethanolamine | MEA | 2.0 | | Hydrochloric acid | 8 | — |
| Ex. 11 | Imidazole-4,5-dicarboxylic acid | ImDC | 5.0 | Choline | Hydrochloric acid | 10 | ◎ |
| Ex. 12 | Imidazole-4,5-dicarboxylic acid | ImDC | 5.0 | Choline | Hydrochloric acid | 9 | ◎ |
| Ex. 13 | Imidazole-4,5-dicarboxylic acid | ImDC | 5.0 | Choline | Hydrochloric acid | 8 | ◎ |
| Ex. 14 | 3-Amino-1,2,4-triazole-5-carboxylic acid | ATAZ-5CA | 5.0 | Choline | Hydrochloric acid | 10 | ◎ |
| Ex. 15 | 3-Amino-1,2,4-triazole-5-carboxylic acid | ATAZ-5CA | 5.0 | Choline | Hydrochloric acid | 9 | ○ |

*Removability by monoethanolamine (pH 8-10) as the standard

<Evaluation 2: Damage to Cu and Co (Etching Rate)>
[Damage to Cu]
An 8-inch silicon wafer with Cu film formed on the surface by electrolytic plating and CVD method was cut into 1.5×1.5 cm$^2$, immersed in an oxalic acid aqueous solution (1.0 wt %) at 25° C. for 2 minutes without stirring, and subjected to ultrapure water rinse and drying, then the wafer was immersed in a polyethylene container containing 48 mL of each cleaning liquid composition at 30° C. for 1 minute without stirring; then, the Cu concentration in the cleaning liquid composition from which the wafer was removed was measured by ICP-MS, and the etching rate (E.R.) of Cu of the cleaning liquid composition was calculated from the surface area of Cu of the wafer and the concentration of Cu in the cleaning liquid composition. Each cleaning liquid composition was adjusted to a predetermined pH by measuring the pH of a chelating agent aqueous solution prepared to a predetermined concentration with a pH meter and dropping a basic compound. Tables 4 and 5 show the composition and results (numerical values) of the cleaning liquid compositions, and FIGS. 4 to 6 show the results (graphs).

[Damage to Co]

An 8-inch silicon wafer with Co film formed on the surface by electrolytic plating and CVD method was cut into 1.5×1.5 cm$^2$, immersed in an oxalic acid aqueous solution (1.0 wt %) at 25° C. for 5 seconds without stirring, and subjected to ultrapure water rinse and drying, then the wafer was immersed in a polyethylene container containing 48 mL of each cleaning liquid composition at 30° C. for 1 minute without stirring; then, the Co concentration in the cleaning liquid composition from which the wafer was removed was measured by ICP-MS, and the etching rate (E.R.) of Co of the cleaning liquid composition was calculated from the surface area of Co of the wafer and the concentration of Co in the cleaning liquid composition. Each cleaning liquid composition was adjusted to a predetermined pH by measuring the pH of a chelating agent aqueous solution prepared to a predetermined concentration with a pH meter and dropping a basic compound. Tables 4 and 5 show the composition and results (numerical values) of the cleaning liquid compositions, and FIGS. 4 to 6 show the results (graphs).

Examples 16 to 27, Comparative Examples 12 to 22

Evaluation of the damage to Cu and Co (Evaluation 2) was carried out for the cleaning liquid compositions of the present invention containing the following nitrogen-containing heterocyclic monocyclic aromatic compounds that have no amino group and have one or more carboxyl groups or ester groups, but that have only amino groups directly bonded to the nitrogen-containing heterocyclic ring when having one or more amino groups: trans-urocanic acid (Urc) (Example 16), pyrazole-3,5-dicarboxylic acid (PDC) (Example 17), pyrazole-3-carboxylic acid (3-PCA) (Example 18), pyrazole-4-carboxylic acid (4-PCA) (Examples 19 and 25), tetrazole-5-acetic acid (TZZ-5AA) (Example 20), imidazole-4-carboxylic acid (ImCA) (Example 21), imidazole-4,5-dicarboxylic acid (ImDC) (Example 22), methyl 1,2,4-triazole-3-carboxylate (TAZCA) (Example 23) or 3-amino-1,2,4-triazole-5-carboxylic acid (ATAZ-5CA) (Examples 24, 26, 27).

In addition, as comparative examples, evaluation of the damage to Cu and Co (Evaluation 2) was carried out for the cleaning liquid compositions containing the following: L-histidine (His) (comparative examples 12, 20 to 22), histamine (Him) (comparative example 13), imidazole (Imz) (comparative example 14), pyrazole (Pyz) (comparative example 15), 1,2,4-triazole (TAZ) (comparative example 16), tetrazole (TZZ) (comparative example 17), 3-amino-5-hydroxypyrazole (AHP) (comparative example 18), and 4-(hydroxymethyl)imidazole hydrochloride (Im-OH) (comparative example 19).

TABLE 4

| | | | | | pH 12 E.R./A min$^{-1}$ | | pH 11 E.R./A min$^{-1}$ | |
| | Compound | | Content/ mM | Basic compound | Cu | Co | Cu | Co |
|---|---|---|---|---|---|---|---|---|
| Com. ex. 12 | L-histidine | His | 0.05 | Choline | 0.5 | 0.7 | 0.4 | 1.8 |
| Com. ex. 13 | Histamine | Him | 0.05 | Choline | 1.6 | 0.2 | 1 | 0.2 |
| Com. ex. 14 | Imidazole | Imz | 0.05 | Choline | 0.32 | 0.09 | 0.03 | 0.06 |
| Com. ex. 15 | Pyrazole | Pyz | 0.05 | Choline | 0.54 | 0.08 | 0.06 | 0.05 |
| Com. ex. 16 | 1,2,4-Triazole | TAZ | 0.05 | Choline | 0.79 | 0.1 | 0.09 | 0.07 |
| Com. ex. 17 | Tetrazole | TZZ | 0.05 | Choline | 0.2 | 0.1 | 0 | 0.1 |
| Com. ex. 18 | 3-Amino-5-hydroxypyrazole | AHP | 0.05 | Choline | 0.34 | 0.08 | 0.07 | 0.07 |
| Com. ex. 19 | 4-(Hydroxymethyl)imidazole hydrochloride | Im-OH | 0.05 | Choline | 0.31 | 0.1 | 0.04 | 0.07 |
| Ex. 16 | trans-Urocanic acid | Urc | 0.05 | Choline | 0.23 | 0.1 | 0.02 | 0.06 |
| Ex. 17 | Pyrazole-3,5-dicarboxylic acid | PDC | 0.05 | Choline | 0.36 | 0.16 | 0.06 | 0.12 |
| Ex. 18 | Pyrazole-3-carboxylic acid | 3-PCA | 0.05 | Choline | 0.45 | 0.15 | 0.05 | 0.09 |
| Ex. 19 | Pyrazole-4-carboxylic acid | 4-PCA | 0.05 | Choline | 1.45 | 0.14 | 0.13 | 0.08 |
| Ex. 20 | Tetrazole-5-acetic acid | TZZ-5AA | 0.05 | Choline | 0.3 | 0.1 | 0 | 0.1 |
| Ex. 21 | Imidazole-4-carboxylic acid | ImCA | 0.05 | Choline | 0.61 | 0.14 | 0.05 | 0.09 |
| Ex. 22 | Imidazole-4,5-dicarboxylic acid | ImDC | 0.05 | Choline | 1.24 | 0.12 | 0.25 | 0.07 |
| Ex. 23 | Methyl 1,2,4-triazole-3-carboxylate | TAZCA | 0.05 | Choline | 0.64 | 0.15 | 0.11 | 0.09 |
| Ex. 24 | 3-Amino-1,2,4-triazole-5-carboxylic acid | ATAZ-5CA | 0.05 | Choline | 0.51 | 0.11 | 0.41 | 0.2 |

TABLE 5

Cu and Co etching rates (pH 8-pH 10)

| | Compound | | Content/ mM | Basic compound* | pH adjuster | pH 10 E.R./A min$^{-1}$ Cu | pH 10 E.R./A min$^{-1}$ Co | pH 9 E.R./A min$^{-1}$ Cu | pH 9 E.R./A min$^{-1}$ Co | pH 8 E.R./A min$^{-1}$ Cu | pH 8 E.R./A min$^{-1}$ Co |
|---|---|---|---|---|---|---|---|---|---|---|---|
| Com. ex. 20 | L-histidine | His | 0.2 | Choline MEA | | 2.3 | 8.2 | | | | |
| Com. ex. 21 | L-histidine | His | 0.2 | Choline MEA | | | | 1.9 | 12.4 | | |
| Com. ex. 22 | L-histidine | His | 0.2 | Choline | Hydrochloric acid | | | | | 2.0 | 13.1 |
| Ex. 25 | Pyrazole-4-carboxylic acid | 4-PCA | 0.2 | Choline MEA | | 0.3 | 0.5 | | | | |
| Ex. 26 | 3-Amino-1,2,4-triazole-5-carboxylic acid | ATAZ-5CA | 0.2 | Choline MEA | | 1.4 | 0.5 | 0.4 | 0.5 | | |
| Ex. 27 | 3-Amino-1,2,4-triazole-5-carboxylic acid | ATAZ-5CA | 0.2 | Choline | Hydrochloric acid | | | | | 0.3 | 0.7 |

*MEA: Monoethanolamine

<Evaluation 3: Measurement of Cu Zeta Potential>

0.05 g of Cu spherical powder with a diameter of 2.48 μm was mixed with 20 g of ultrapure water, and stirred for 10 minutes using an ultrasonic device for uniform dispersion, then 0.4 mL of this solution was collected and added to 50 mL of each cleaning liquid solution. These solutions were further stirred, homogenized, and evaluated for the zeta potential of Cu using a zeta potential measurement device. Table 6 shows the results (numerical values), and FIG. 7 shows the results (graphs).

Examples 28 to 33, Comparative Examples 23 to 29

Measurement of Cu zeta potential (Evaluation 3) was carried out for the cleaning liquid compositions of the present invention containing the following nitrogen-containing heterocyclic monocyclic aromatic compounds that have no amino group and have one or more carboxyl groups or ester groups, but that have only amino groups directly bonded to the nitrogen-containing heterocyclic ring when having one or more amino groups: pyrazole-3,5-dicarboxylic acid (PDC) (Example 28), pyrazole-3-carboxylic acid (3-PCA) (Example 29), pyrazole-4-carboxylic acid (4-PCA) (Example 30), imidazole-4-carboxylic acid (ImCA) (Example 31), imidazole-4,5-dicarboxylic acid (ImDC) (Example 32) or methyl 1,2,4-triazole-3-carboxylate (TAZCA) (Example 33).

In addition, as comparative examples, zeta-potential measurement of Cu (Evaluation 3) was carried out for the cleaning liquid compositions containing the following: choline (comparative example 23), L-histidine (His) (comparative example 24), histamine (Him) (comparative example 25), imidazole (Imz) (comparative example 26), pyrazole (Pyz) (comparative example 27), 3-amino-5-hydroxypyrazole (AHP) (comparative example 28), 4-(hydroxymethyl)imidazole hydrochloride (Im-OH) (comparative example 29).

TABLE 6

Cu zeta potential

| | Compound | | Content/ mM | Basic compound | pH | Zeta potential |
|---|---|---|---|---|---|---|
| Com. ex. 23 | Choline | choline | | Choline | 12 | −67 |
| Com. ex. 24 | L-histidine | His | 0.1 | Choline | 12 | −73 |
| Com. ex. 25 | Histamine | Him | 0.1 | Choline | 12 | −40 |
| Com. ex. 26 | Imidazole | Imz | 0.05 | Choline | 12 | −62 |
| Com. ex. 27 | Pyrazole | Pyz | 0.05 | Choline | 12 | −62 |
| Com. ex. 28 | 3-Amino-5-hydroxypyrazole | AHP | 0.05 | Choline | 12 | −63 |
| Com. ex. 29 | 4-(Hydroxymethyl)imidazole hydrochloride | Im-OH | 0.05 | Choline | 12 | −58 |
| Ex. 28 | Pyrazole-3,5-dicarboxylic acid | PDC | 0.02 | Choline | 12 | −76 |
| Ex. 29 | Pyrazole-3-carboxylic acid | 3-PCA | 0.05 | Choline | 12 | −71 |
| Ex. 30 | Pyrazole-4-carboxylic acid | 4-PCA | 0.05 | Choline | 12 | −71 |
| Ex. 31 | Imidazole-4-carboxylic acid | ImCA | 0.05 | Choline | 12 | −67 |
| Ex. 32 | Imidazole-4,5-dicarboxylic acid | ImDC | 0.05 | Choline | 12 | −71 |
| Ex. 33 | Methyl 1,2,4-triazole-3-carboxylate | TAZCA | 0.05 | Choline | 12 | −76 |

<Evaluation 4: Removability of Fine Particles>

An 8-inch silicon wafer with Cu film formed on the surface by electrolytic plating was polished for 30 seconds using a CMP apparatus and a CMP slurry (silica slurry (φ 35 nm)). Thereafter, using a cleaning apparatus, brush scrub cleaning with each cleaning liquid composition was performed for 30 seconds at room temperature, rinsed for 30 seconds with ultrapure water and spin dried. Regarding the wafer after cleaning, the number of fine particles remaining on the surface and having a diameter of more than 0.202 μm was counted using a surface inspection device to evaluate the cleaning ability (fine particle removability). Table 7 shows the composition of the cleaning liquid compositions and the results of the Evaluation 4 together with the results of the Evaluations 1 to 3.

Example 34, Comparative Examples 30 and 31

Evaluation of fine particle removability (Evaluation 4) was carried out for the cleaning liquid composition of the present invention containing the following nitrogen-containing heterocyclic monocyclic aromatic compounds that have no amino group and have one or more carboxyl groups or ester groups, but that have only amino groups directly bonded to the nitrogen-containing heterocyclic ring when having one or more amino groups: pyrazole-3,5-dicarboxylic acid (PDC) (example 34).

In addition, as comparative examples, the evaluation of fine particle removability (Evaluation 4) was carried out for the cleaning liquid compositions containing L-histidine (His) (comparative examples 30, 31).

removability of Cu-BTA complex at a pH within a predetermined range, and at the same time, since the etching rate for Cu and Co is reduced, even in the case of using a state-of-the-art semiconductor substrate having a layer of Co as a barrier metal layer, for example, the present composition can efficiently remove Cu-BTA complex without damaging both the Cu wiring and the barrier metal.

In addition, as is apparent from Table 6 and FIG. 7, in the cleaning liquid compositions of the present invention containing a nitrogen-containing heterocyclic monocyclic aromatic compound that has one or more carboxyl groups or ester groups, but that has only amino groups directly bonded to the nitrogen-containing heterocyclic ring when having one or more amino groups (examples 28 to 33), the surface potential (zeta potential) of Cu spherical powder can be a negative value of large absolute value at a pH within a predetermined range. As a result, the removability of organic residues which are fine particles derived from Cu such as Cu-BTA is improved, and the re-deposition thereof is prevented.

Furthermore, as apparent from Table 7, when a silicon wafer surface is polished and then cleaned using the cleaning liquid composition of the present invention containing a nitrogen-containing heterocyclic monocyclic aromatic compound that has one or more carboxyl groups or ester groups, but that has only amino groups directly bonded to the nitrogen-containing heterocyclic ring when having one or more amino groups (examples 34), fine particles on the surface of the silicon wafer can be efficiently removed at a pH within a predetermined range.

TABLE 7

Fine particle removability

| | Compound | | Content/ mM | Basic compound | Content/ mM | Basic compound | Content/ mM | Phosphonic acid compound |
|---|---|---|---|---|---|---|---|---|
| Com. ex. 30 | L-histidine | His | 0.5 | Choline | 2 | TEA | 1.3 | NTMP |
| Com. ex. 31 | L-histidine | His | 0.1 | Choline | 3.3 | MEA | 2 | NTMP |
| Ex. 34 | Pyrazole-3, 5-dicarboxylic acid | PDC | 0.1 | Choline | 10 | | | NTMP |

| | Content/ mM | pH | E.R./A min$^{-1}$ Cu | Co | Zeta potential/ mV | Cu-BTA removability* | Cleaning ability Φ > 0.202 μm† |
|---|---|---|---|---|---|---|---|
| Com. ex. 30 | 0.1 | 11.0 | 0.6 | 1.4 | −77 | X | 330 |
| Com. ex. 31 | 0.02 | 11.4 | 0.9 | 0.4 | −64 | X | 567 |
| Ex. 34 | 0.02 | 12.0 | 0.8 | 0.5 | −77 | ◉ | 197 |

*Choline (pH 12) as the standard

As apparent from Tables 1 to 5 and FIGS. 4 to 6, the cleaning liquid compositions of the present invention containing a nitrogen-containing heterocyclic monocyclic aromatic compound that has one or more carboxyl groups or ester groups, but that has only amino groups directly bonded to the nitrogen-containing heterocyclic ring when having one or more amino groups (examples 1 to 27) have high On the other hand, as is also apparent from Tables 1 to 7 and FIGS. 4 to 7, the cleaning liquid compositions without containing a nitrogen-containing heterocyclic monocyclic aromatic compound that has one or more carboxyl groups or ester groups, but that has only amino groups directly bonded to the nitrogen-containing heterocyclic ring when having one or more amino groups (comparative examples 1 to 31)

correspond to at least one of the following: they have low removability of Cu-BTA complex, they have high etching rate for Cu and/or Co, they have no capability of making the surface potential (zeta potential) of Cu spherical powder a negative value of large absolute value, or they have low removability of fine particles.

The invention claimed is:

1. A cleaning liquid composition for cleaning a substrate having Cu wiring, consisting of:
   (a) one or more basic compounds selected from quaternary ammonium compounds and alkanolamines;
   (b) one or more nitrogen-containing heterocyclic monocyclic aromatic compounds having one or more carboxyl groups or ester groups, but having only amino groups directly bonded to the nitrogen-containing heterocyclic ring when having one or more amino groups; and
   (c) one or more selected from phosphonic acid chelating agents, anionic surfactants, nonionic surfactants, amino acids, diluting solution, aprotic polar organic solvents, protic organic solvents, sugars, sugar alcohols, inorganic acids, carboxylic acids, sulfonic acids, pH adjuster;
   wherein the cleaning liquid composition has a pH of 8 to 12,
   with a proviso that the nitrogen-containing heterocyclic ring is not a pyrazole ring.

2. The cleaning liquid composition of claim 1, wherein the nitrogen-containing heterocyclic monocyclic aromatic compound is a compound of a general formula (A):

[Chemical formula 1]

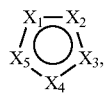

(A)

wherein:

$X_1$ to $X_5$ are, each independently of one another, $CR_1$, $CR_1R_2$, N, $NR_1$, O or S, provided that at least two of $X_1$ to $X_5$ are N or $NR_1$, $R_1$ and $R_2$ are, when a plurality of them are present, each independently of one another, a hydrogen atom or a substituent, provided that at least one of $R_1$ and $R_2$ present in the general formula (A) has a carboxyl group, a substituent having a carboxyl group, an ester group, or a substituent having an ester group.

3. The cleaning liquid composition of claim 2, wherein at least one of $R_1$ and $R_2$ present in the general formula (A) is an amino group.

4. The cleaning liquid composition of claim 1, wherein the concentration of the phosphonic acid chelating agent at the time of use is 0.005 mM to 0.1 mM.

5. A stock solution composition for the cleaning liquid composition of claim 1, which is used to obtain said cleaning liquid composition by diluting 10 times to 1000 times.

6. A method of manufacturing a semiconductor substrate, comprising a step of bringing the cleaning liquid composition of claim 1 into contact with a substrate having Cu wiring.

7. The method of manufacturing a semiconductor substrate of claim 6, comprising a step of chemical mechanical polishing (CMP) the substrate having Cu wiring prior to the step of bringing the cleaning liquid composition into contact with the substrate having Cu wiring.

8. The method of manufacturing a semiconductor substrate of claim 6, wherein the step of bringing the cleaning liquid composition into contact with the substrate having Cu wiring is a step of cleaning the substrate having Cu wiring.

* * * * *